(12) United States Patent
Shepard

(10) Patent No.: US 9,871,043 B2
(45) Date of Patent: Jan. 16, 2018

(54) 4F2 SCR MEMORY DEVICE

(71) Applicant: HGST, Inc., San Jose, CA (US)

(72) Inventor: Daniel R. Shepard, North Hampton, NH (US)

(73) Assignee: HGST, Inc., San Jose, CA (US)

( * ) Notice: Subject to any disclaimer, the term of this patent is extended or adjusted under 35 U.S.C. 154(b) by 94 days.

(21) Appl. No.: 14/841,672

(22) Filed: Aug. 31, 2015

(65) Prior Publication Data

US 2017/0062432 A1    Mar. 2, 2017

(51) Int. Cl.
*H01L 27/102*    (2006.01)
*H01L 29/74*    (2006.01)
*H01L 23/528*    (2006.01)

(52) U.S. Cl.
CPC ........ *H01L 27/1027* (2013.01); *H01L 23/528* (2013.01); *H01L 29/7412* (2013.01)

(58) Field of Classification Search
CPC   H01L 27/1027; H01L 23/528; H01L 29/7412
See application file for complete search history.

(56) References Cited

U.S. PATENT DOCUMENTS

2010/0232200 A1* 9/2010 Shepard ............. G11C 13/0004
365/51

* cited by examiner

*Primary Examiner* — Roy Potter
*Assistant Examiner* — Paul Patton
(74) *Attorney, Agent, or Firm* — Patterson + Sheridan, LLP; Steven H VerSteeg

(57) ABSTRACT

A memory-array is disclosed in which an array of threshold switching devices is constructed having an area per transistor of $2F^2$. This array of threshold switching devices is suitable for a variety of memory or other applications including PRAM, MRAM, RRAM, FRAM, OPT-RAM and 3-D memory.

19 Claims, 15 Drawing Sheets

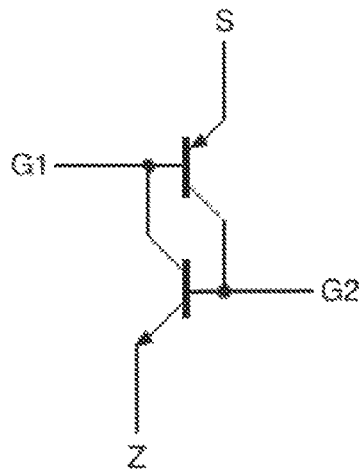
FIG. 1A
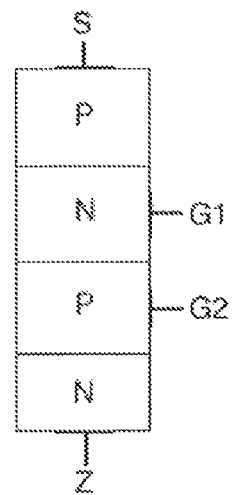
FIG. 1B
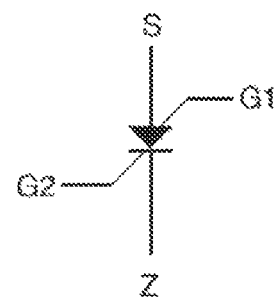
FIG. 1C
FIGURE 1
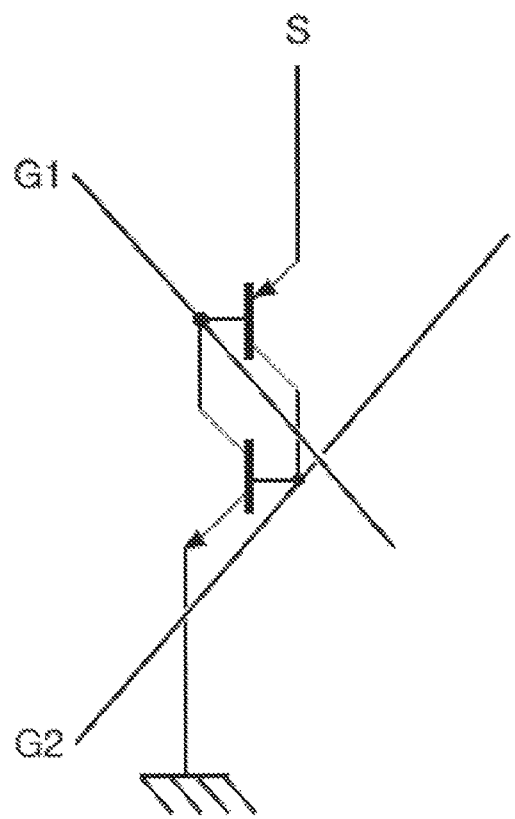
FIGURE 2

4F2 SCR MEMORY DEVICE

CROSS-REFERENCE TO RELATED APPLICATIONS

This application makes reference to and incorporates herein by reference in its entirety, U.S. Patent Application No.: 62/006,957, by Shepard, titled "4F$^2$ SCR Memory Device" that was filed Jun. 3, 2014, U.S. Patent Application No. 61/209,725, by Shepard titled "4F$^2$ Memory Cells Comprising Three or Four Terminal Active Devices" that was filed on Mar. 10, 2009, U.S. Patent Application No. 61/275,169, by Shepard titled "3-D Resistive Change Memory" that was filed on Aug. 26, 2009, and U.S. Pat. No. 7,376,008 by Shepard titled "SCR Matric Storage Device" that issued on May 20, 2008.

TECHNICAL FIELD

In various embodiments, the present invention relates to arrays of threshold switching devices as they relate to memory devices, and more particularly to arrays of threshold switching devices arrayed in one or two or more dimensions and that have a high packing density for use in memory devices.

BACKGROUND

As advances continue to be made in the area of semiconductor memory devices, high capacity and low cost will be increasingly important. In particular, memory cell designs having a footprint no larger than 2F$^2$ are increasingly desired to provide high density. However, because of parasitic resistance in bit lines and word lines, increasingly large arrays result in non-negligible voltage drops across these bit lines and word lines. To deal with this parasitic resistance problem, memory arrays are broken down into multiple tiles or sub-arrays such that the bit lines and word lines are shorter and, therefore, have lower voltage drops from end to end. However, each sub array or tile will always require some peripheral support circuitry and this extra peripheral support circuitry reduces in array efficiency. U.S. Pat. No. 7,376,008 by Shepard titled "SCR Matrix Storage Device" issued on May 20, 2008 (the '008 patent) describes a memory array constructed with Current Level Switching Devices (CLSD's) such as SCR's or four layer diodes. CLSD devices switch when a voltage level is exceeded and, as such, are to a certain extent analog devices as opposed to purely digital devices. Many memory design engineers are skilled in the digital logic design, but fewer engineers are trained in analog design.

SUMMARY

The present invention is a means and a method for manufacturing memory arrays having the same packing density as a diode array. The present invention is a means and a method for fabricating vertically constructed CLSD's that can be tightly packed into an array for information storage applications. The present invention will be useful for many information storage technologies that require high capacity. In the present invention, diode decoder arrays are connected to the pair of control gates in an array of memory cells that utilize CLSD's as their select switches.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIG. 1 depicts three symbolic representations of a CLSD, also known as a thrystor, Shockley diode, four-layer diode, PNPN diode, or SCR.

FIG. 2 depicts a single CLSD showing the Gate1 control input being connected to a word line and the Gate2 control input being connected to a bit line that is orthogonal to the word line in accordance with various embodiments of the invention.

DETAILED DESCRIPTION

Figure 3:
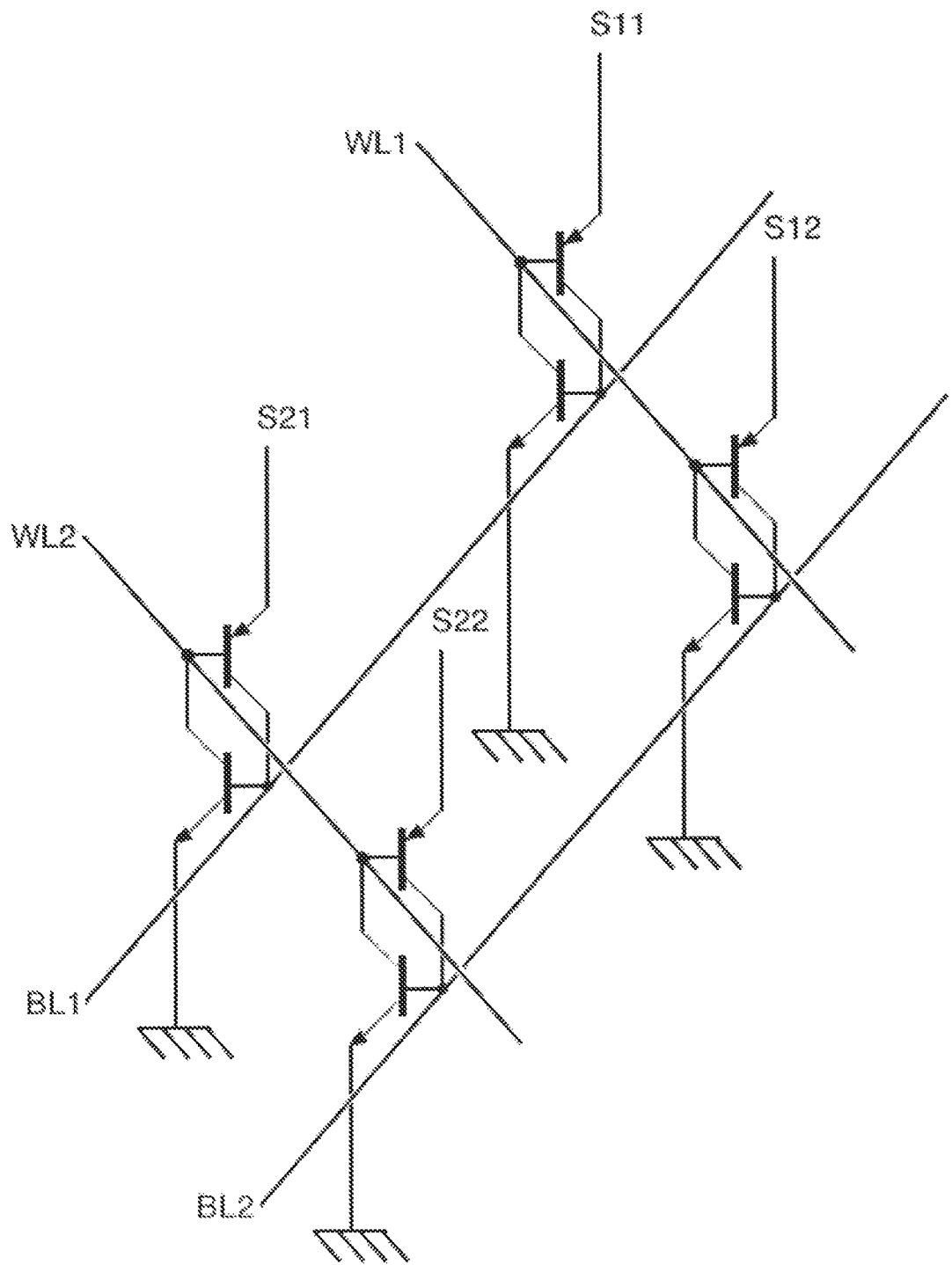
FIG. 3 depicts a 2 by 2 array of CLSD's showing the Gate1 control input being connected to one or two word lines and the Gate2 control input being connected to one of two bit lines that are orthogonal to the word lines in accordance with various embodiments of the invention.

The 2F$^2$ threshold switching device array can be fabricated using standard techniques and equipment. With this approach, arrays of threshold switching devices are fabricated in a vertical orientation. It is an aspect of the present invention that the highest packing density is not required and that CLSD's can be fabricated without the sharing of the gate control inputs as may be desirable to form peripheral circuits to support the operation of a high density memory array.

FIG. 1 illustrates three symbolic representations of a CLSD, also known as a thryster, Shockley diode, four-layer diode, PNPN diode, or SCR. FIG. 1A illustrates the twin-bipolar-transistor model that may be utilized to describe characteristics of the devices utilized in embodiments of the present invention. In this model, a positive voltage (such as Vpp) is applied to the PNP transistor's emitter S and a lower voltage is applied to the NPN transistor's emitter Z. In a two-terminal device (i.e., if terminals G1 and G2 are ignored for a moment), by raising the positive voltage, leakage current through the PNP transistor's collector to the base of the NPN transistor causes the NPN to begin to turn on. This starts to turn on the PNP transistor, forming a positive feedback loop that eventually causes the full device to avalanche and switch on. If a negative voltage (or a voltage lower than that which would otherwise occur at point G2) is applied to terminal G2, the leakage current that causes avalanche is drawn away from the NPN transistor's base and makes avalanche more difficult (a greater positive voltage may be required at terminal S). However, if the voltage at point G2 is raised, this helps to turn on the NPN transistor and makes avalanche easier (a lesser positive voltage may be required at terminal S). Likewise, if a positive voltage (or a voltage greater than that which would otherwise occur at point G1) is applied to terminal G1, the leakage current that causes avalanche is drawn away from the PNP transistor's base and makes avalanche more difficult (a lower positive voltage may be required at terminal S). However, if the voltage at point G1 is lowered, this helps to turn on the PNP transistor and makes avalanche easier (a greater positive voltage may be required at terminal S). These characteristics are well known and understood to those skilled in the art.

FIG. 1B illustrates a generalized silicon device structure, and FIG. 1C illustrates the schematic symbol of the device. For the present discussion, we will also refer to the S contact as the top contact and the Z contact as the bottom contact (while recognizing that the voltages and orientations can all be reversed to achieve a comparably functioning device). Other switching type devices may also be utilized in the embodiments of the present invention.

FIG. 2 depicts a single CLSD memory cell selector switch showing the Gate1 control input being connected to a word line and the Gate2 control input being connected to a bit line that is orthogonal to the word line.

FIG. 3 depicts a plurality of CLSD memory cell selector switches in a 2 by 2 array showing the Gate1 control inputs being connected to one of two word lines and the Gate2 control inputs being connected to one or two bit lines that are orthogonal to the word lines. Typical memory arrays would have a much greater number of memory cells connected by many more word lines and bit lines. In operation, individual information storage elements would be connected between each of the S inputs S11, S12, S21, and S22 and a positive supply voltage (subject to restrictions, described below) and the bottom Z connections would be grounded (zero volts), typically through the substrate. If the resulting positive voltage at any one or more of the S inputs exceeds the switching threshold for the corresponding CLSD, that CLSD device will exhibit avalanche switching and that CLSD will conduct current. To prevent any column of CLSD's (such as the CLSD's corresponding to S11 and S21 or the CLSD's corresponding to S12 and S22) from exhibiting avalanche switching, the bit line (BL1 or BL2, respectively) corresponding to that column of CLSD's is pulled low (as explained above). Likewise, to prevent any row of CLSD's (such as the CLSD's corresponding to S11 and S12 or the CLSD's corresponding to S21 and S22) from exhibiting avalanche switching, the word line (WL1 or WL2, respectively) corresponding to that row of CLSD's is pulled high. To select the CLSD at the point of intersection of any one bit line and word line (say, for example, the CLSD corresponding to S11), all of the bit lines other than the bit line connected to the CLSD corresponding to S11 would be pulled low and all of the word lines other than the word line connected to the CLSD corresponding to S11 would be pulled high. The remaining bit line (BL1) and word line (WL1) would be allowed to float or, in the alternative a slightly positive voltage could be applied to the remaining word line (WL1); these voltages are selected to make avalanche switching occur more easily. As the selected CLSD switches, the voltage at the bit line connection point will shift towards about 0.7V (corresponding to the forward biased base-emitter junction of the NPN device if the CLSD is a silicon device), the voltage at the word lines connection point will shift towards about 0.2V (corresponding to the saturated collector-emitter voltage of the NPN device if the CLSD is a silicon device), and the voltage at the top connection point S11 will shift toward about 0.9V (corresponding to the forward biased base-emitter junction of the PNP device above the voltage on the word line, 0.2V as explained just about, if the CLSD is a silicon device). Different semiconducting materials would have different junction voltages and the voltage levels would differ accordingly. Once switches, the voltage on the word line and bit line would settle at a convergence point at roughly half of the 0.9V point. Current through the device would be determined by the difference between the positive supply voltage and the voltage at the S input of the selected CLSD divided by the resistance of the information storage element connected in between that positive supply and the S input.

Note now a restriction on the positive supply voltage applied to the non-selected CLSD's that share the word line with the selected CLSD. Since the avalanche switched selected CLSD will result in pulling the connected word line towards 0.2V, any other CLSD sharing that word line will experience a potential current path (with the current passing through its connected information storage element) from the S input through its emitter-base junction of its PNP to that word line. As a result, each column of CLSD's must be connected to an individual bit line corresponding to that column of CLSD's) and only the positive supply line comprising a connection to the CLSD to be selected should be energized with a positive voltage. As a result, in a large fine-pitched array where the positive supply lines will have to be long and thin to fit the array pitch, there will be a parasitic resistance in those long, thin positive supply lines. An alternative approach to address this parasitic resistance is depicted in FIGS. 4 and 5.

Figure 4:
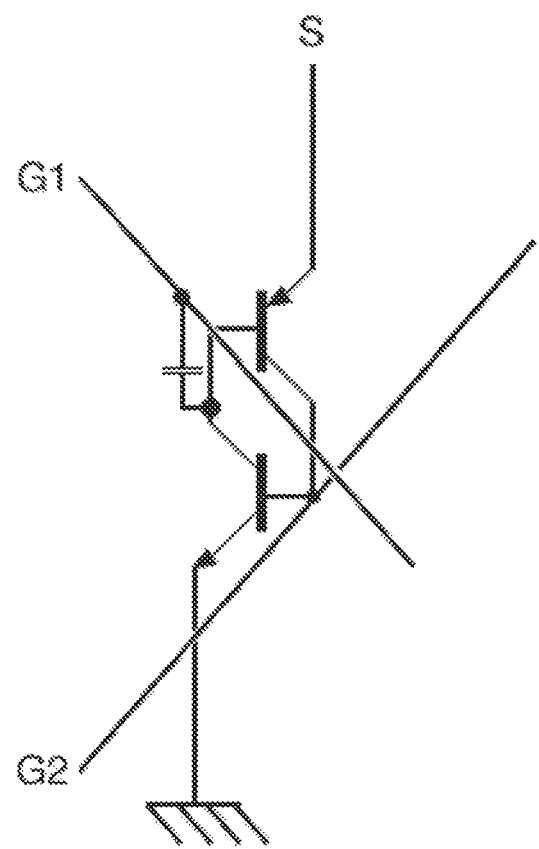
FIG. 4 depicts a single CLSD showing the Gate1 control input being capacitively connected to a word line and the Gate2 control input being connected to a bit line that is orthogonal to the word line in accordance with various embodiments of the invention.

FIG. 4 depicts a single CLSD memory cell selector switch showing the Gate1 control input being capacitively connected to a word line and the Gate2 control input being connected to a bit line that is orthogonal to the word line. In FIG. 4 the connection between the word line and the Gate1 input is made through a capacitor. By doing this, a pulse can be passed from the word line to the CLSD's Gate1, but once the CLSD has been avalanche switched and the Gate1 potential drops as described above, the capacitively connected Gate1's of the non-selected CLSD's connected to that same word line will not provide a current path through the PNP's of other CLSD's connected to that same word line.

Figure 5:
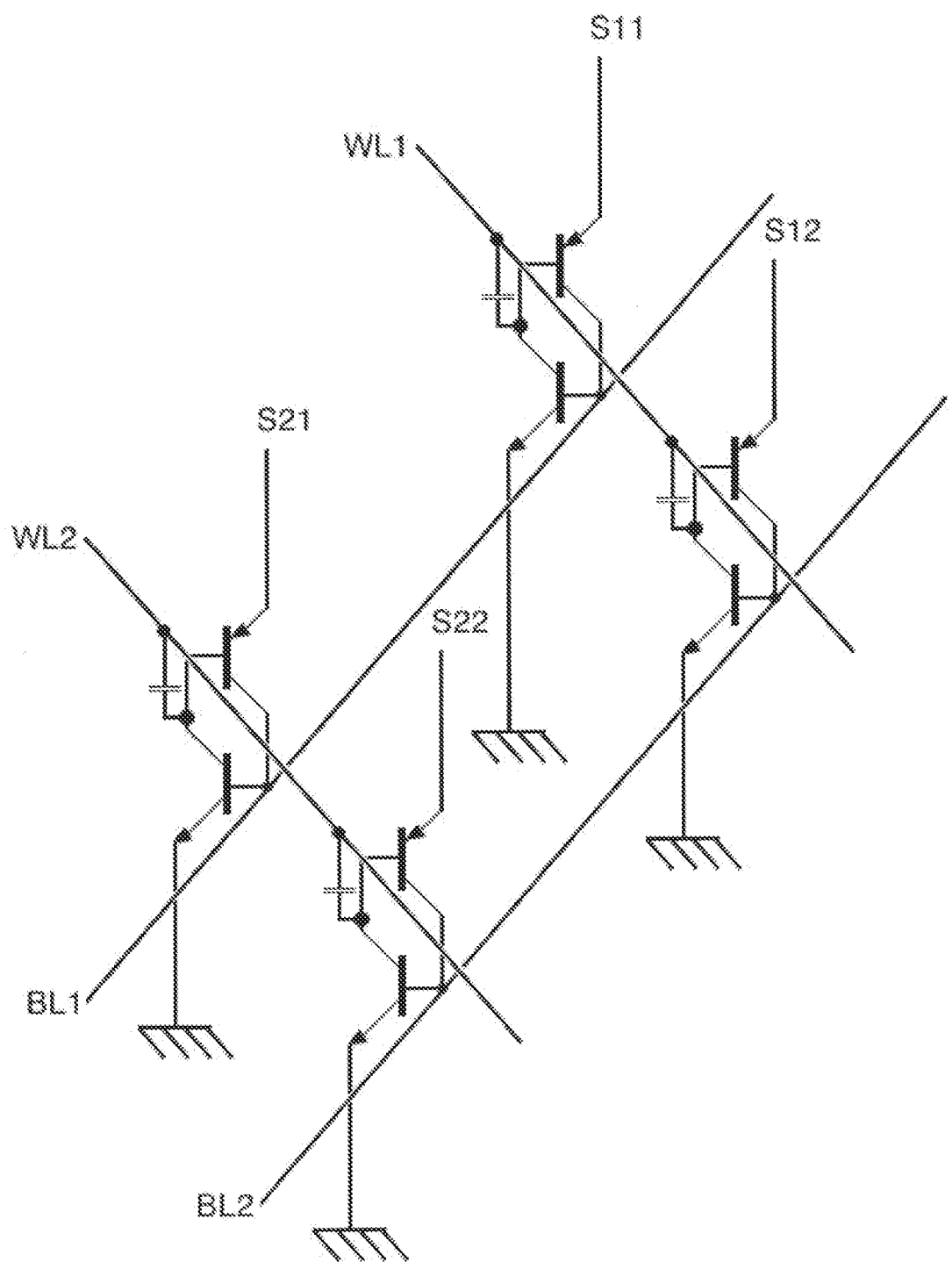
FIG. 5 depicts a 2 by 2 array of CLSD's showing the Gate1 control input being capacitively connected to one or two word lines and the Gate2 control input being connected to one or two bit lines that are orthogonal to the word lines in accordance with various embodiments of the invention.

FIG. 5 depicts a plurality of CLSD memory cell selector switches in a 2 by 2 array showing the Gate1 control inputs being capacitively connected to one or two word lines and the Gate2 control inputs being connected to one or two bit lines that are orthogonal to the word lines. In operation, individual information storage elements would be connected between each of the S inputs S11, S12, S21, and S22 and a positive supply voltage (subject to restrictions, described below) and the bottom Z connections would be grounded (zero volts), typically through the substrate. If the resulting positive voltage at any one or more of the S inputs exceeds the switching threshold for the corresponding CLSD, that CLSD device will exhibit avalanche switching and that CLSD will conduct current. To prevent any column of CLSD's (such as the CLSD's corresponding to S11 and S21 or the CLSD's corresponding to S12 and S22) from exhibiting avalanche switching, the bit line (BL1 or BL2, respectively) corresponding to that column of CLSD's is puled low (as explained above). Likewise, to prevent any row of CLSD's (such as the CLSD's corresponding to S11 and S12 or the CLSD's corresponding to S21 and S22) from exhibiting avalanche switching. However, in this variation, while the word line (WL1 or WL2, respectively) corresponding to that row of CLSD's is pulled high, the voltage on these word lines has no effect on the switching threshold. To select the CLSD at the point of intersection of any one bit line and word line (say, for example, the CLSD corresponding to S11), all of the bit lines other than the bit line connected to the CLSD corresponding to S11 would be puled low thereby preventing any CLSD connected to these bit lines from being avalanche switched on. The remaining bit line (BL1) would be allowed to float or, in the alternative, a slightly positive voltage could be applied to the remaining bit line (BL1); this voltage, if applied, is selected to make avalanche switching occur more easily but does not, in itself, cause switching to occur. To invoke avalanche switching, a low-going voltage is applied to the word line corresponding to the CLSD to be selected. This low-going edge will couple through the capacitor into Gate1 in order to shift the threshold and initiate avalanche switching. Those CLSD's connected to those bit lines that are being pulled low (i.e., those bit lines to non-selected CLSD's) will not switch whereas the intended CLSD (to which the bit line is either floating or being pulled slightly positive) will switch. Because the connection from the CLSD's connected to the selected word line is made through a capacitor, there will be no path for current as there was in the noted exception for the version having no capacitor and only the information storage element connected in series with the selected CLSD will experience current flow. As a result, a much larger positive voltage line (one that connects many of the CLSD memory cells or even all of the CLSD memory cells) can be used; this larger positive voltage line will thereby have much lower parasitic resistance. In one preferred embodiment of the present invention, all of the bottom Z connections to the CLSD memory cells would be connected to the substrate (which would be grounded) for a very low resistance path from any CLSD memory cell to ground, and all of the top S connections (each through its corresponding, serially connected information storage element) would be connected together to a single conductive connection for the positive supply that would have an area comparable to the area of the memory array. The voltage level for this positive supply would be controlled for erasing or programming or reading a given memory cell; this control could include shifting this positive supply after avalanche switching of the selected CLSD memory cell if the corresponding information storage element were to require a voltage for programming or erasing or reading that would be high enough to cause a false avalanche switching in a non-selected CLSD memory cell. The current form the positive supply could also be measureable for sensing and reading the information stored in the selected CLSD memory cell.

Embodiments of the present invention will typically, though not necessarily, be built as integrated circuits by means of photolithography. In the directly connected word line to Gate1 version of the present invention depicted in FIG. 3, the word lines can be grown in trenches using selective epitaxial silicon growth techniques that are well known to those skilled in the art. In this way, trenches running between the CLSD devices will fill with silicon at the same time that silicon for the upper P and N layers for the upper P-N junction is grown.

Figure 6:
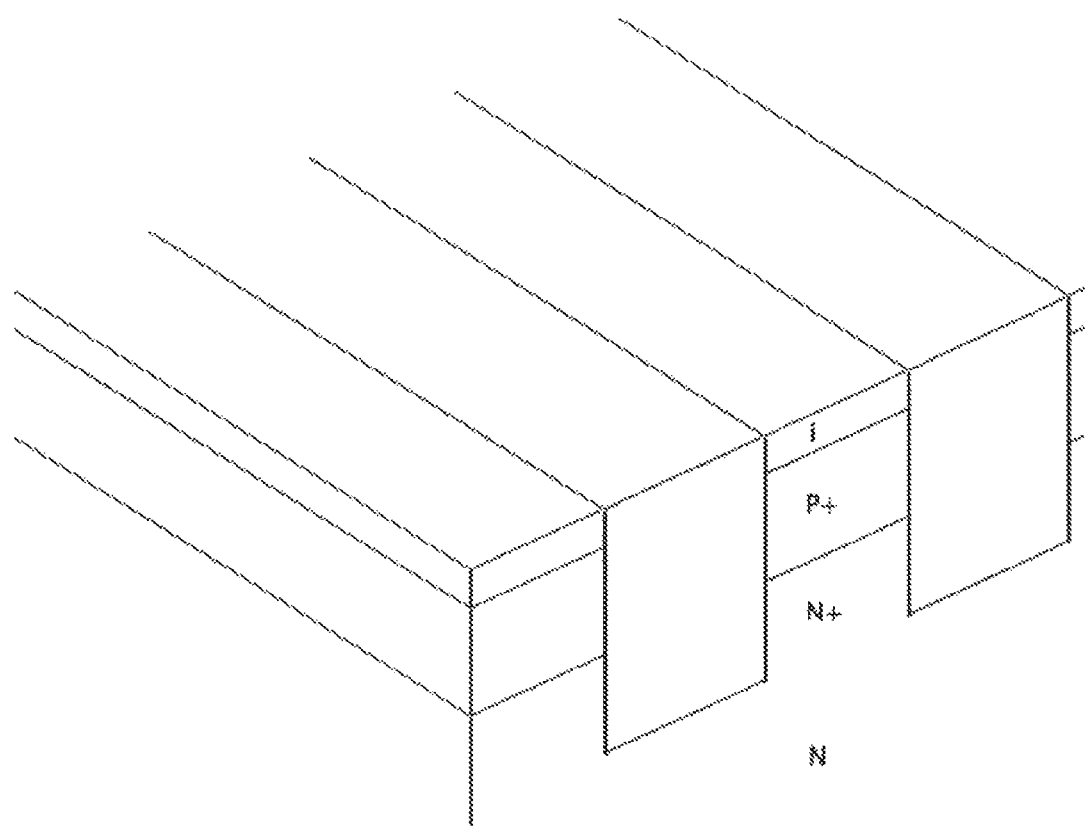
FIGS. 6-10 depict the present invention according to the schematic depicted in FIG. 3 at various stages of manufacture.

In FIG. 6, an initial substrate of N-type silicon was layered with N+, P+ and lastly an optional intrinsic layer of silicon. This layer stack can be formed in a variety of ways known to those skilled in the art including implanting, deposition, and growth (e.g., by epitaxial growing of silicon). Through these layers, the bit lines are formed by etching a first set of trenches, filling these trenches with oxide or some other dielectric material and planarizing the surface (e.g., by CMP or etchback). These techniques are well known and understood by those skilled in the art, and particularly by those skilled in the art of shallow trench isolation (STI) formation. The key aspect is that the trenches extend well below the P+ layer such that the bit lines (formed in the P+ layer material) are separated into a plurality of parallel lines.

Figure 7:
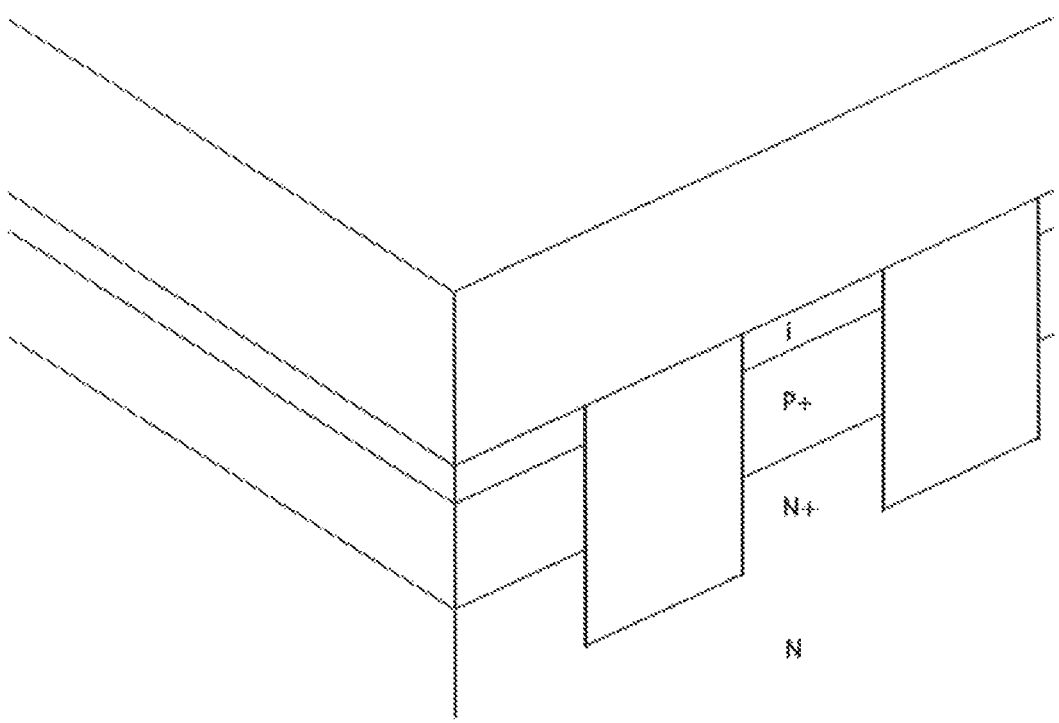
Figure 8:
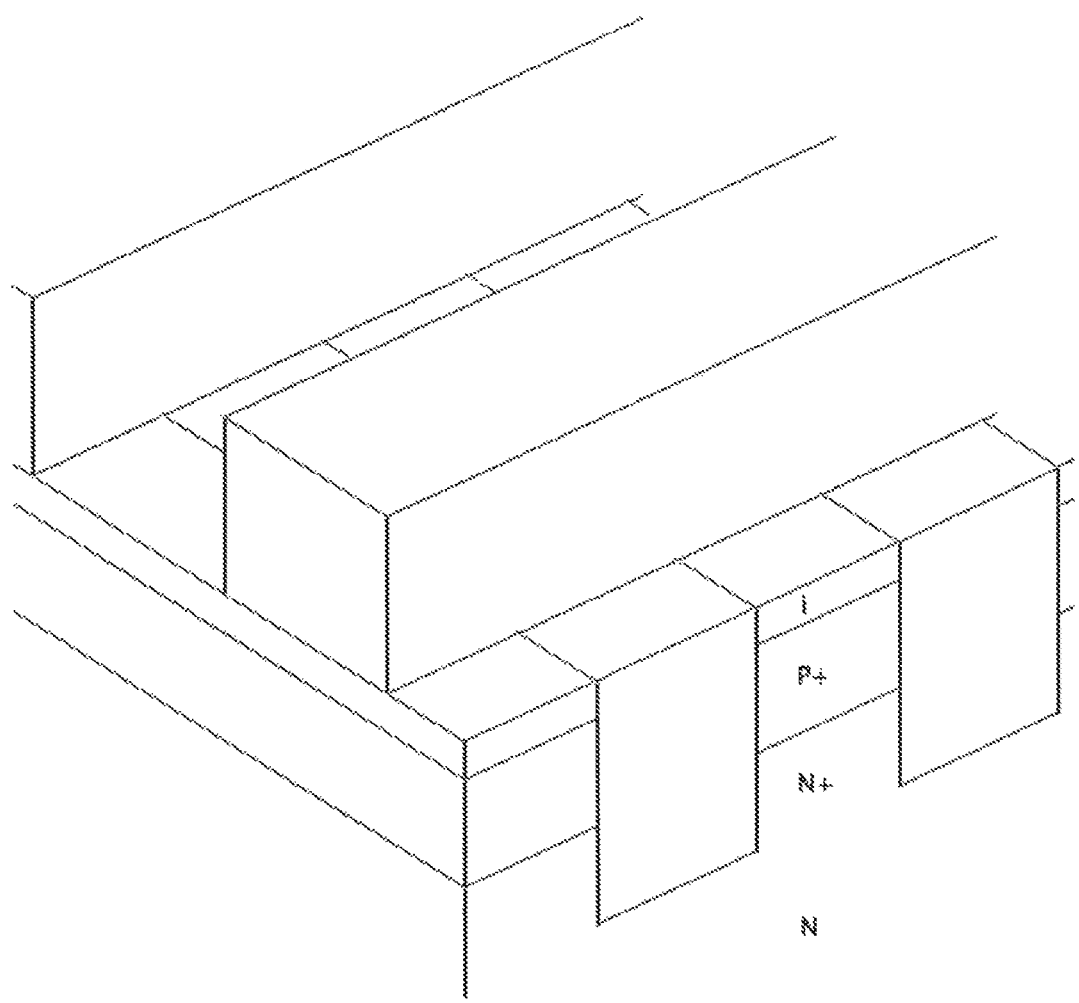
Figure 9:
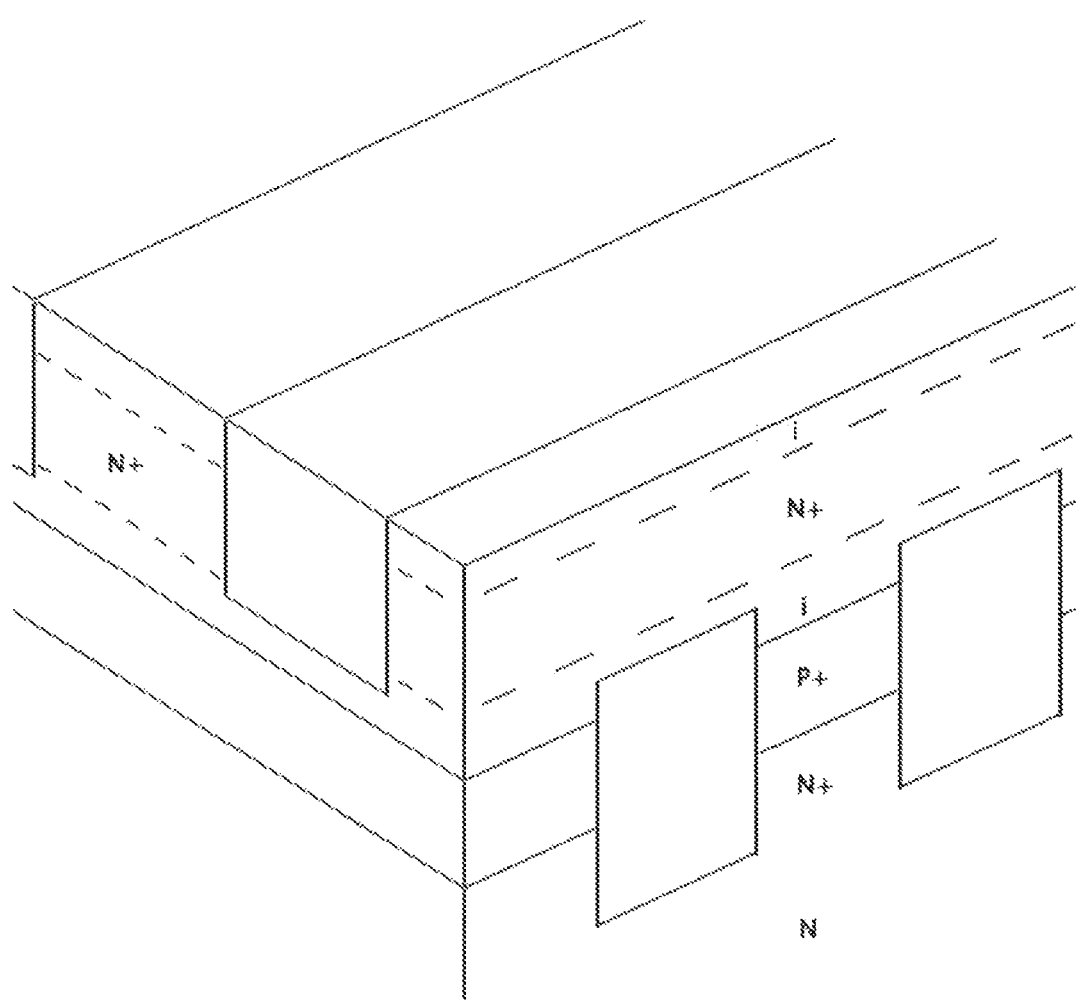
Figure 10:
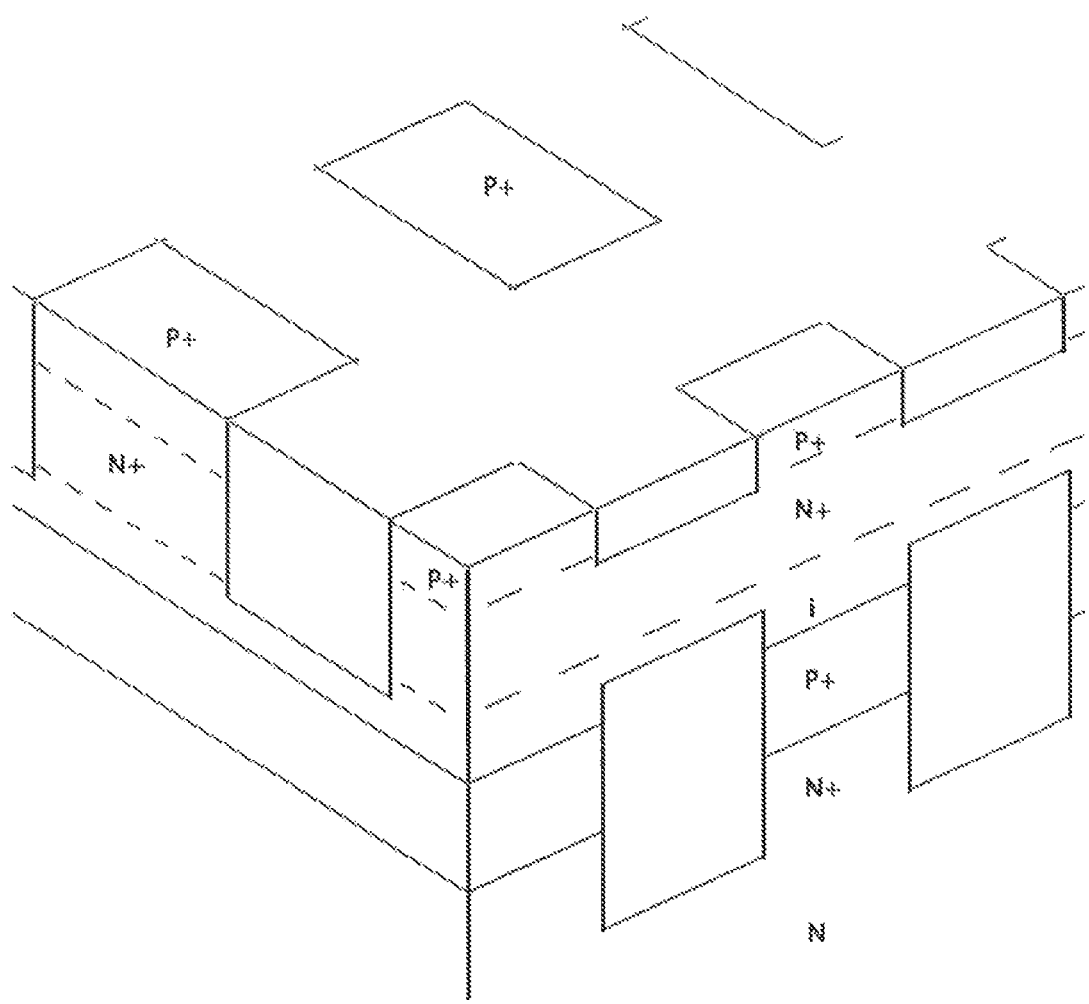

Having formed the bit lines, a layer of dielectric material is deposited (FIG. 7) into which a second set of trenches is etched (FIG. 8). These trenches extend to the surface created following the planarizing of the STI trenches to expose the i-type silicon areas. These second trenches are then filled with silicon, doped with N-type dopant and then planarized so as to form a plurality of separated word lines (formed in the N+ layer material). The key aspect is that the N+ dopant layer not be deeper than the bottom of the remaining dielectric such that the formed word lines are separated into a plurality of parallel word lines (FIG. 9). Filling with silicon can be performed by selective epitaxial growth such that as the trench is filled using the exposed i-type silicon areas as seeding points, the epi silicon will grow both upwards and sideways within the trenches to fill the trenches and form the word lines. Doping can be done after the silicon is deposited or grown (preferably after planarization) of dopant can be incorporated while the silicon is being deposited or grown. Finally, as is shown in FIG. 10, a third set of trenches (generally above the initial STI trenches) is etched and filled with dielectric and planarized. A P+ dopant implant is added (preferably after planarizing) to form the top layer of the CLSD device and this implant should have a depth shallower than the depth of the final third trenches.

Figure 11:
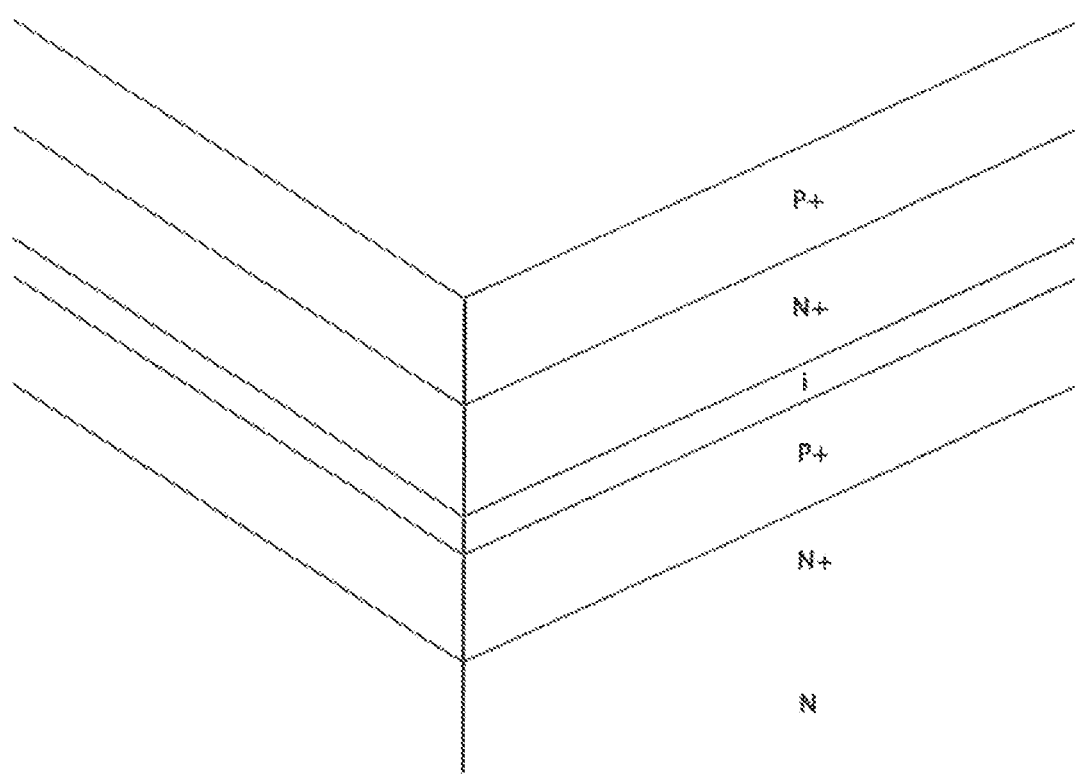
FIGS. 11-16 depict the present invention according to the schematic depicted in FIG. 5 at various stages of manufacture.
Figure 12:
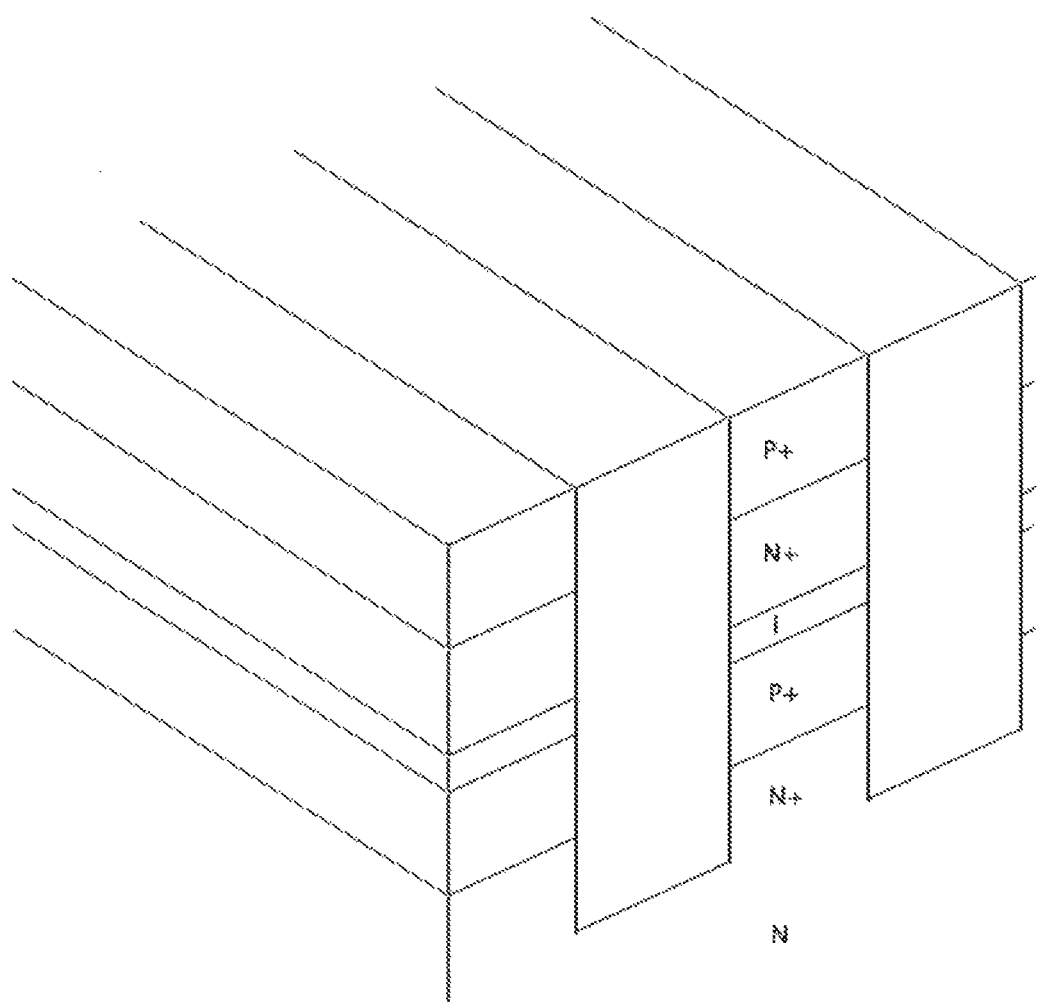
Figure 13:
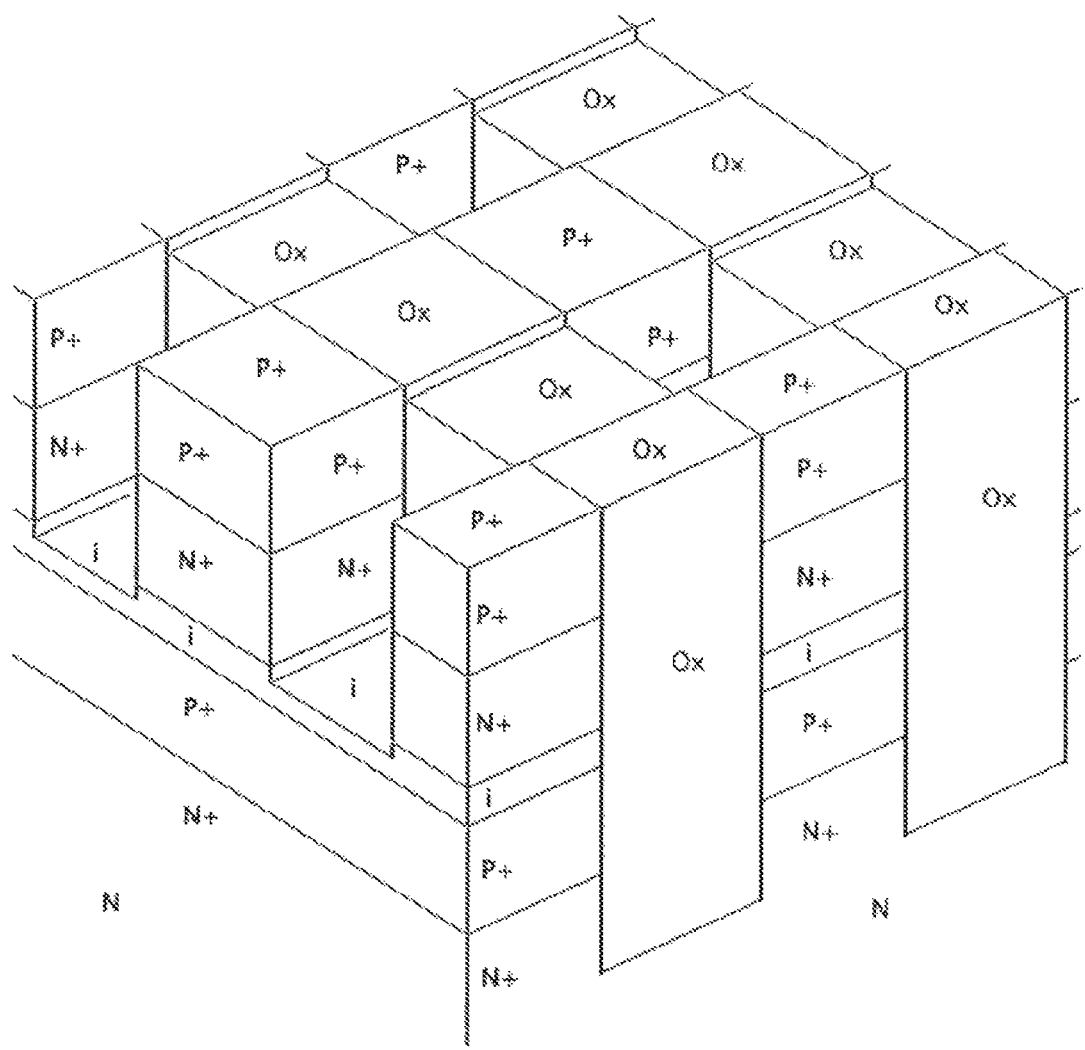
Figure 14:
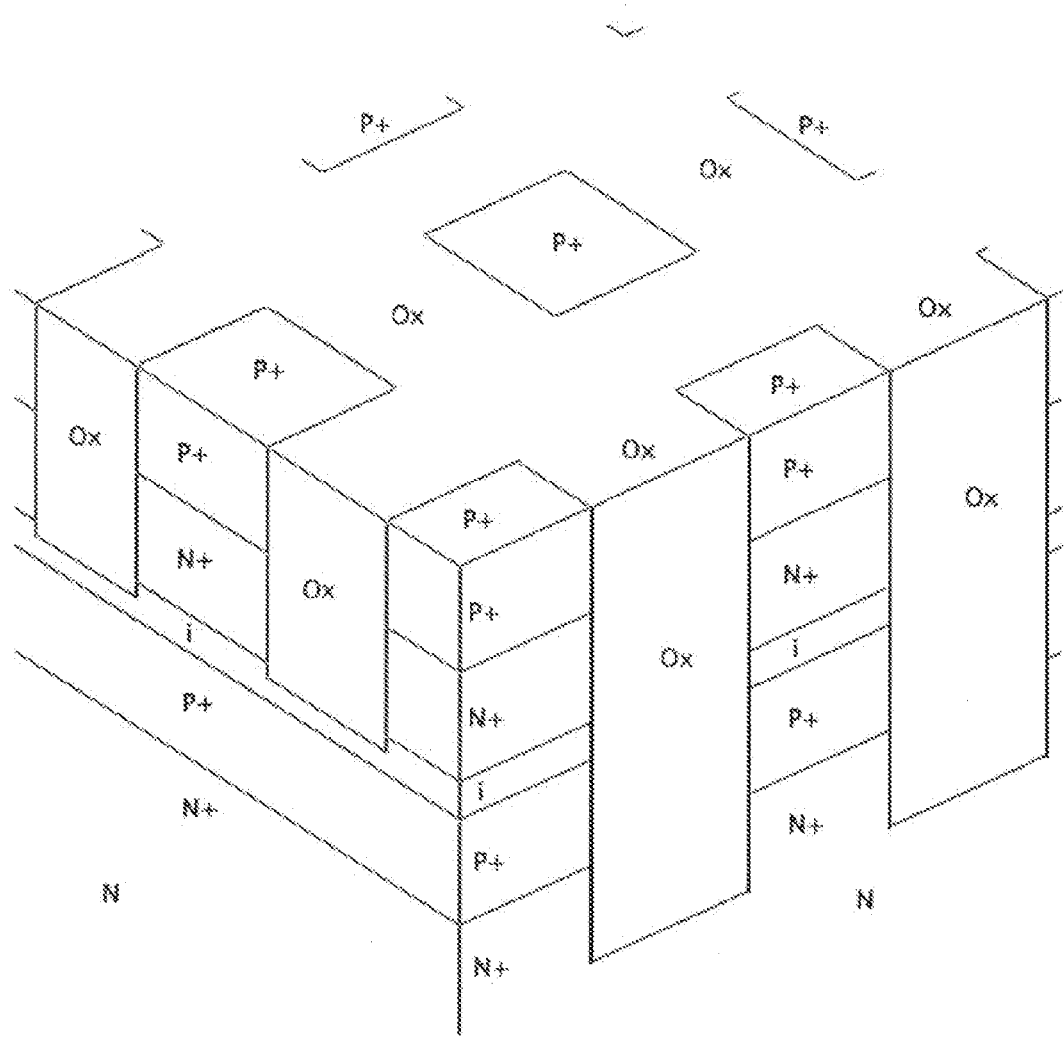

A variation on the present invention (e.g., a variation shown in FIG. 5) would have the substrate prepared with the full CLSD stack (P-N-i-P-N) as show in FIG. 11 and this stack is then deeply etched to form the first plurality of trenches and then filled with dielectric (e.g., silicon dioxide or ox) and planarized for the STI formation (FIG. 12). The resulting structure is then etched with an orthogonal set of second trenches through the upper N+ layer but not through the lower P+ layer (e.g., into the optional i-type layer as shown in FIG. 13) and these second trenches are filled with dielectric (e.g., ox) and planarized (FIG. 14). This results in the formation of bit lines as before.

Figure 15:
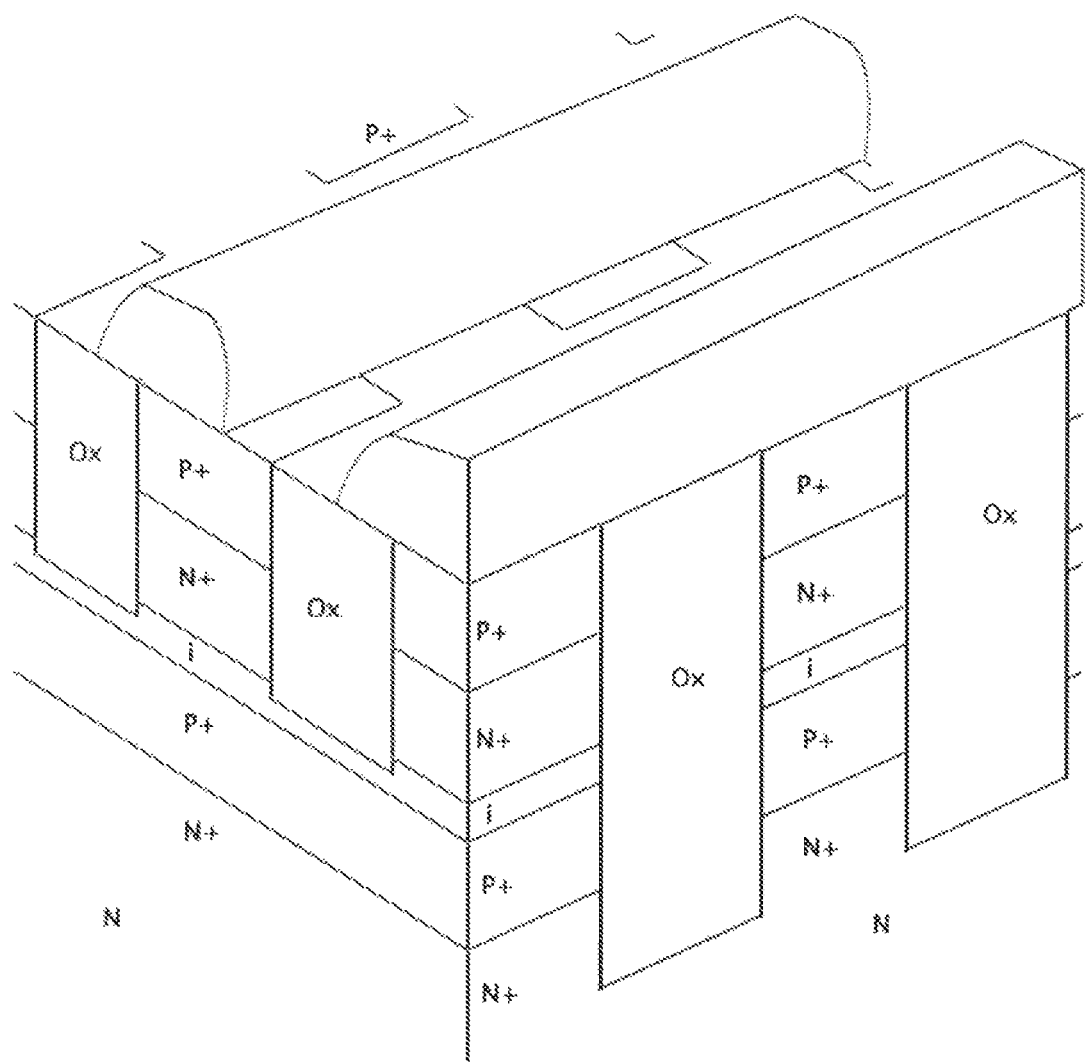
Figure 16:
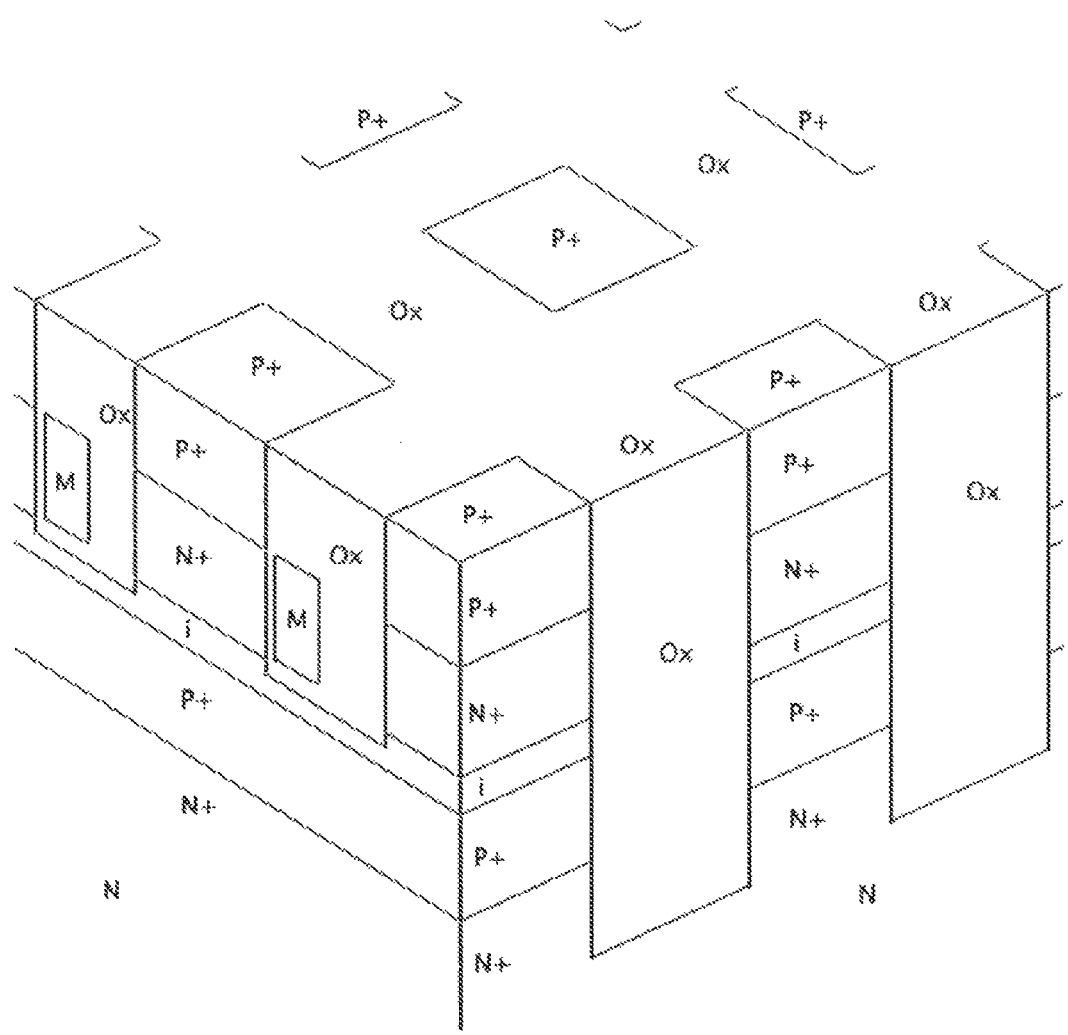

To form the capacitively coupled word lines, a portion of those shallower second trenches is etched back (e.g., with an offset plurality of parallel etch masking lines as shown in FIG. 15), and this dielectric etch (which is selective to etch dielectric and not silicon) is then filled with conductive material such as metal. A metal etch is then employed to lower the top surface of the metal to the height of the upper N+ layer and the resulting trench is filled back up with dielectric (e.g., ox) and the whole structure is planarized to expose the tops of the CLSD devices as before (FIG. 16).

Standard techniques well understood to those skilled in the art would then be employed to pattern, etch and interconnect the word lines, bit lines, and substrate connections as well as to incorporate the information storage elements to be connected to the tops of the CLSD's.

The word lines and bit lines are ideally suited for diode decoding arrays as the address decoding means. For example, a bit line can be used to prevent its associated line of CLSD's from being triggered by being pulled low (i.e., to disable a line of CLSD's). A diode decoder array takes complementary address inputs (e.g., active low assert) to pull down all but one line. If pulled to ground, a diode array will pull the disabled lines to one diode forward voltage drop (Vf) above ground (i.e., 0.7V for a silicon P-N junction diode). This is a marginal voltage to apply to the bit lines to prevent CLSD's from triggering, as described above. However, a schottky diode such as an N+ silicon to aluminum schottky diode has a Vf closer to 0.2V and by pulling to ground with such as diode, the voltage on the bit line would be below the 0.7V level towards which the bit line connection point will shift (corresponding to the forward biased base-emitter junction of the NPN device if the CLSD is a silicon device). This voltage below the forward voltage of the base-emitter junction of the NPN device of the CLSD keeps that base-emitter junction form becoming forward biased thereby preventing the CLSD from turning on. For the word lines the polarities are reversed, that is to say a diode decoder array in which the diodes are laid out with their directions reversed such that the disabling operation occurs when the inputs are pulled high (e.g., active high assert) can be used to disable the word lines in similar fashion. There are many examples of diode decoder array operation in the prior art, including U.S. Pat. No. 5,673,218 by Shepard.

Embodiments may be implemented with a traditional two dimensional arrangement of storage elements or with a three-dimensional arrangement of storage elements. In the capacitively connected Gate1 version of the present invention, only one CLSD memory cell will be switched at a time and large top positive supply voltage contacts can be employed. In addition, a three dimensional implementation can be employed by layering information storage elements where any information storage element will be connected between the top positive supply voltage contacts corresponding to its layer and a vertical post connected to the S contact of its corresponding CLSD switch. The CLSD switch will provide a low impedance path to ground for the vertical post passing through (but, electrically insulated from) the layers of top positive supply voltage contacts. Connecting between the vertical post and each top positive voltage contact layer would be an information storage element.

The information storage elements may include a fuseable material, an antifuseable material, a phase-change material (for PRAM) such as a chalcogenide alloy material (including a chalcogenide in which the programmed resistivity may be one of two resistance values and, in the case of more than one bit per cell storage cells, in which the programmed resistivity may be one or three or more resistance values), a resistive change material (for PRAM), a ferroelectric material (for FRAM), a magnet or magnetoresistive material (for MRAM), magnetic tunnel junction or spin-transfer torque element (for MTJ-RAM or STT-RAM), a dual layer oxide memory element comprising a junction and an insulating metal oxide and a conductive metal oxide (see U.S. Pat. No. 6,753,561 by Rinerson), or a trapped charge device (see U.S. Pat. No. 7,362,609) by Harrison, et al). The phase-change material, such as a Chalcogenide material, may be programmed or erased. Orientation of the array may be rotated, i.e., the "rows" may be "columns" or vice versa. The polarity of the voltages and direction of the steering elements in the storage bits may be reversed while still keeping what is envisioned by embodiments of the present invention. The present invention may be applied to other memory technologies as well including static RAM, Flash memory, EEPROM, DRAM, and others not mentioned, including memory technologies yet to be commercialized or invented.

Memory devices incorporating embodiments of the present invention may be applied to memory devices and systems for storing digital text, digital books, digital music (such as MP3 players and cellular telephones), digital audio, digital photographs (wherein one or more digital still images may be stored including sequences of digital images), digital video (such as personal entertainment devices), digital cartography (wherein one or more digital maps can be stored, such as GPS devices), and any other digital or digitized information as well as any combinations thereof. Devices incorporating embodiments of the present invention may be embedded or removable, and may be interchangeable among other devices that can access the data therein. Embodiments of the invention may be packaged in any variety of industry-standard form factor, including Compact Flash, Secure Digital, MultiMedia Cards, PCMIA Cards, Memory Stick, any of a large variety of integrated circuit packages including Ball Grid Arrays, Dual In-Line Packages (DIPs), SOICs, PLCC, TQFPs and the like, as well as in proprietary form factors and custom designed packages. These packages may contain just the memory chip, multiple memory chips, one or more memory chips along with other logic devices or other storage devices such as PLDs, PLAs, micro-controllers, microprocessors, controller chips or chip-sets or other custom standard circuitry.

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

While the foregoing is directed to embodiments of the present invention, other and further embodiments of the invention may be devised without departing from the basic scope thereof, and the scope thereof is determined by the claims that follow.

What is claimed is:

1. A memory device comprising an array of bipolar junction transistor devices whereby at least one of the gate connections to the bipolar junction devices is manufactured by growing silicon laterally in a trench;
   a plurality of bit lines that are parallel to one another; and
   a plurality of word lines that are parallel to one another, wherein each bit line is coupled to a plurality of information storage elements and each word line is coupled to the plurality of information storage elements wherein each information storage element is coupled to a respective input, a positive voltage supply and to ground.

2. The memory device of claim 1 further comprising one or more diode decoder arrays.

3. The memory device of claim 2 further comprising one or more schottky diodes.

4. The memory device of claim 1 further comprising having a plurality of CLSD devices in a two dimensional array whereby the bottom contacts are connected by the substrate.

5. The memory device of claim 1 further comprising having a plurality of CLSD devices in a two dimensional array whereby the top contacts, with an information storage element in series, are connected by a single top contact.

6. The memory device of claim 5 whereby the storage elements comprises at least one selected from the list of a phase-change material, a resistive ram material, a one-time-programmable material, a fuseable material, and an anti-fuseable material.

7. A memory array, comprising:
a plurality of threshold switching devices is constructed having an area per transistor of $2F^2$ wherein the switching devices are bipolar junction transistors.

8. The memory array of claim 7 wherein a control input of the transistor is capacitively connected to one or two word lines.

9. The memory array of claim 8, wherein and a gate control input is connected to one or two bit lines that are orthogonal to word lines.

10. The memory array of claim 7, comprising:
a plurality of bit lines that are parallel to one another; and
a plurality of word lines that are parallel to one another, wherein the pluralities of bit lines are orthogonal to the plurality of word lines.

11. The memory array of claim 10, wherein each bit line is coupled to a plurality of information storage elements.

12. The memory array of claim 11, wherein each word line is coupled to a plurality of information storage elements.

13. The memory array of claim 12, wherein each information storage element is coupled to a respective input.

14. The memory array of claim 13, wherein each information storage element is additionally coupled to a positive voltage supply.

15. A memory array, comprising:
a plurality of bipolar junction transmitters is constructed having an area per transistor of $2F^2$ a plurality of bit lines that are parallel to one another; and
a plurality of word lines that are parallel to one another, wherein the pluralities of bit lines are orthogonal to the plurality of word lines wherein each bit line is coupled to a plurality of information storage elements wherein each word line is coupled to a plurality of information storage elements wherein each information storage element is coupled to a respective input wherein each information storage element is additionally coupled to a positive voltage supply wherein each information storage element is additionally coupled to ground.

16. The memory array of claim 15, wherein the plurality of information storage elements includes a first information storage element, a second information storage element, a third information storage element and a fourth information storage element, wherein the plurality of bit lines comprises a first bit line and a second bit line, and wherein the plurality of word lines comprises a first word line and a second word line.

17. The memory array of claim 16, wherein the first bit line is coupled to the first information storage element and the second information storage element, wherein the first word line is coupled to the first information storage element and the third information storage element.

18. The memory array of claim 17, wherein the second bit line is coupled to the third information storage element and the fourth information storage element and wherein the second word line is coupled to the second information storage element and the fourth information storage element.

19. The memory array of claim 18, further comprising one or more schottky diodes.

* * * * *